United States Patent
Zhou et al.

(10) Patent No.: US 6,251,781 B1
(45) Date of Patent: Jun. 26, 2001

(54) METHOD TO DEPOSIT A PLATINUM SEED LAYER FOR USE IN SELECTIVE COPPER PLATING

(75) Inventors: Mei Sheng Zhou; Guo-Qin Xu, both of Singapore (SG); Lap Chan, San Francisco, CA (US)

(73) Assignees: Chartered Semiconductor Manufacturing Ltd.; National University of Singapore, both of Singapore (SG)

( * ) Notice: Subject to any disclaimer, the term of this patent is extended or adjusted under 35 U.S.C. 154(b) by 0 days.

(21) Appl. No.: 09/374,312

(22) Filed: Aug. 16, 1999

(51) Int. Cl.$^7$ .................................................. H01L 21/44
(52) U.S. Cl. .................... 438/687; 438/633; 438/677; 438/674; 427/301; 427/304; 427/305
(58) Field of Search ................................. 438/674, 676, 438/677, 678, 686, 687; 427/304, 305, 301

(56) References Cited

U.S. PATENT DOCUMENTS

| | | | |
|---|---|---|---|
| 4,574,095 | 3/1986 | Baum et al. | 427/53.1 |
| 4,692,349 | 9/1987 | Georgiou et al. | 437/230 |
| 5,308,796 | 5/1994 | Feldman et al. | 437/200 |
| 5,674,787 | 10/1997 | Zhao et al. | 437/230 |
| 5,723,387 | 3/1998 | Chen | 438/692 |
| 5,824,599 | 10/1998 | Schacham-Diamond et al. | 438/678 |
| 5,895,261 | * 7/2000 | Schinella et al. | 438/586 |
| 6,001,730 | * 12/1999 | Farkas et al. | 438/627 |
| 6,087,258 | * 7/2000 | Simpson et al. | 438/678 |
| 6,100,195 | * 8/2000 | Chan et al. | 438/687 |

FOREIGN PATENT DOCUMENTS

| 1195217 | * 6/1970 | (GB) . |
|---|---|---|
| 53068161 | * 10/1967 | (JP) . |

* cited by examiner

Primary Examiner—Caridad Everhart
(74) Attorney, Agent, or Firm—George O. Saile; Rosemary L. S. Pike; Doug Schnabel

(57) ABSTRACT

A method of fabricating single and dual damascene copper interconnects is achieved. A semiconductor substrate layer is provided. Conductive traces are provided in an isolating dielectric layer. An intermetal dielectric layer is deposited overlying the conductive traces and the isolating dielectric layer. The intermetal dielectric layer is patterned to form trenches to expose the top surfaces of the underlying conductive traces. A barrier layer is deposited overlying the intermetal dielectric layer, the exposed conductive traces, and within the trenches. A platinum ionic seed solution is coated inside the trenches and overlying the barrier layer. A platinum seed layer is deposited from the ionic seed solution by exposing the platinum ionic seed solution to ultraviolet light. A copper layer is deposited by electroless plating to form copper interconnects, where the copper layer is only deposited overlying the platinum seed layer in the trenches, and where the deposition stops before the copper layer fills the trenches. The exposed barrier layer is polished down to the top surface of the intermetal dielectric layer. An encapsulation layer is deposited overlying the copper interconnects and the intermetal dielectric layer to complete the fabrication of the integrated circuit device.

19 Claims, 4 Drawing Sheets

US 6,251,781 B1

METHOD TO DEPOSIT A PLATINUM SEED LAYER FOR USE IN SELECTIVE COPPER PLATING

BACKGROUND OF THE INVENTION

1. Field of the Invention

The present invention relates to the fabrication of semiconductor structures, and more particularly, to the formation of damascene interconnects through the creation of platinum seed layers to selectively plate copper in the manufacture of integrated circuits.

2. Description of the Prior Art

As integrated circuit feature sizes continue to decrease, it has become advantageous to construct metal connections out of copper instead of aluminum. Copper has a lower resistivity than aluminum, and therefore can form higher speed connections for a given line width.

The disadvantage of copper, however, is that it is more difficult to reliably etch than aluminum. To create copper traces, therefore, alternative design approaches such as damascene and dual damascene structures have been employed. By using damascene techniques, copper line etches are eliminated. Instead, trenches are first cut into the isolation dielectric material where connective traces are planned. Then the copper is deposited to fill the traces. A polishing process is used to etch back any overfill of copper in the trenches. In this way, damascene approaches allow the use of copper for interconnects.

Referring to FIG. 1, a cross-section of a partially completed prior art dual damascene structure is shown. A substrate layer 10 is depicted. The substrate layer 10 encompasses all underlying layers, devices, junctions, and other features that have been formed prior to the deposition and definition of the conductive traces 18 in the isolation layer 14. A dielectric layer 22 overlies the isolation layer 26 and partially overlies the conductive traces 18.

A via opening is shown formed in the dielectric layer 22 to expose the top surface of the conductive trace 18. A trench is also formed in the dielectric layer 22. A barrier layer 30 is deposited overlying the dielectric layer 22 and the exposed conductive traces 18. The purpose of the barrier layer 30 is to prevent diffusion of the subsequently deposited copper into the conductive traces 18 or the dielectric layer 22. Since the copper layer will be deposited using electroless plating, a seed layer 34 is deposited overlying the barrier layer 30. The purpose of the seed layer 34 is to provide a thin layer of activation atoms to catalyze the electroless plating process. The seed layer 34 may be made up of copper, platinum, or palladium. The seed layer 34 is typically deposited by a physical vapor deposition (PVD) or chemical vapor deposition (CVD) process.

Referring to FIG. 2, the result of the electroless plating deposition of the copper layer 38 is shown. Assuming copper was used as the seed layer 34, the seed layer 34 is absorbed into the copper layer 38 during the deposition process. Note that the copper layer 38 is deposited everywhere on the wafer overlying the barrier layer 30. This universal deposition of the copper layer 38 is because the seed layer 34 was also deposited everywhere on the wafer. To form interconnect elements, both the excess copper layer 38 and the excess barrier layer 30 must be removed. This is typically accomplished by subjecting the wafers to a chemical mechanical polish (CMP).

Referring now to FIG. 3, during the CMP process, the copper layer 38 is polished down to a plug. An encapsulation layer 42 is deposited overlying the copper layer 38 to protect the copper from oxidation during subsequent processing steps.

It would be advantageous to eliminate the CMP process used to polish down the copper layer 38 in the prior art method. To do this, it is helpful to deposit the copper only where it is needed. Likewise, it would be advantageous to simplify, and make less expensive, the process used to form the seed layer 34.

Several prior art approaches attempt to improve electroless plating processes for use in integrated circuit metalization. U.S. Pat. No. 5,674,787 to Zhao et al teaches a process to selectively deposit copper to form interconnect plugs. A copper ion seed layer is used to activate the electroless copper plating process. A dielectric layer is deposited and anisotropically etched to form a dielectric barrier on the sidewalls of the connective trench. An encapsulation layer is electroless plated over the copper plug. U.S. Pat. No. 5,723,387 to Chen discloses an apparatus and a process for forming copper interconnects. Platinum or palladium ions are used as the seed layer to activate the electroless plating of the copper layer. The copper layer is not selectively deposited and a post plating chemical mechanical polish must be done. U.S. Pat. No. 4,574,095 to Baum et al teaches a process to selectively deposit copper by formation of a palladium seed layer by photo-induced decomposition of gaseous complex at a wavelength of 249 nanometers. The electroless plated copper layer is then deposited where the palladium layer is so formed. U.S. Pat. No. 5,824,599 to Schacham-Diamond et al teaches a process to non-selectively deposit a copper layer by electroless plating. An aluminum layer is deposited overlying the copper seed layer to prevent oxidation of the seed layer prior to plating. U.S. Pat. No. 5,308,796 to Feldman et al discloses a process to selectively deposit a copper layer over a metal silicide layer. U.S. Pat. No. 4,692,349 to Georgiou et al discloses a process to electroless plate cobalt or nickel to form via plugs.

SUMMARY OF THE INVENTION

A principal object of the present invention is to provide an effective and very manufacturable method of fabricating integrated circuits with copper interconnects.

A further object of the present invention is to provide a method of fabricating copper interconnects by depositing copper using an electroless plating process.

Another further object of the present invention is to provide a method of fabricating copper interconnects where the copper layer is selectively deposited such that little or no excess copper needs to be removed by chemical mechanical polishing.

Yet another further object of the present invention is to provide a method of fabricating copper interconnects by selective electroless plating of copper catalyzed by a platinum seed layer that is deposited by photo-reduction of a solution of platinum ions.

In accordance with the objects of this invention, a new method of fabricating copper interconnects is achieved. A semiconductor substrate layer is provided. Conductive traces are provided in an isolating dielectric layer. An intermetal dielectric layer is deposited overlying the conductive traces and the isolating dielectric layer. The intermetal dielectric layer is patterned to form trenches to expose the top surfaces of the underlying conductive traces. A barrier layer is deposited overlying the intermetal dielectric layer, the exposed conductive traces, and within the trenches. A platinum ionic seed solution is coated inside the trenches and overlying the barrier layer. A platinum seed layer is deposited from the platinum ionic seed solution by exposing the platinum ionic seed solution to ultraviolet light. A copper layer is deposited by electroless plating to form copper interconnects, where the copper layer is only deposited overlying the platinum seed layer in the trenches, and where the deposition stops before the copper layer fills the trenches. The exposed barrier layer is polished down to the top surface of the intermetal dielectric layer. An encapsulation layer is deposited overlying the copper interconnects and the intermetal dielectric layer. A passivation layer is deposited overlying the encapsulation layer to complete the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 12:
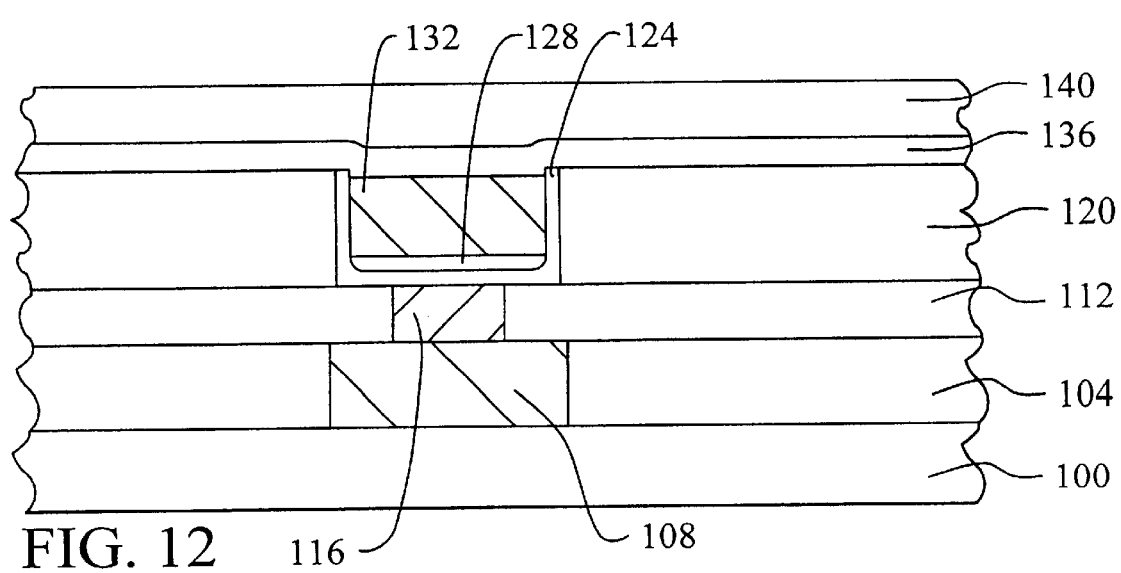

The preferred embodiments of the present invention will be disclosed in detail as applied to the formation of dual damascene copper interconnects. In addition, FIG. 12 illustrates the application of the present invention to the formation of single damascene copper interconnects. Since the key features of the present invention apply to either the single or the dual damascene case, only the dual damascene will be disclosed in detail.

Figure 1:
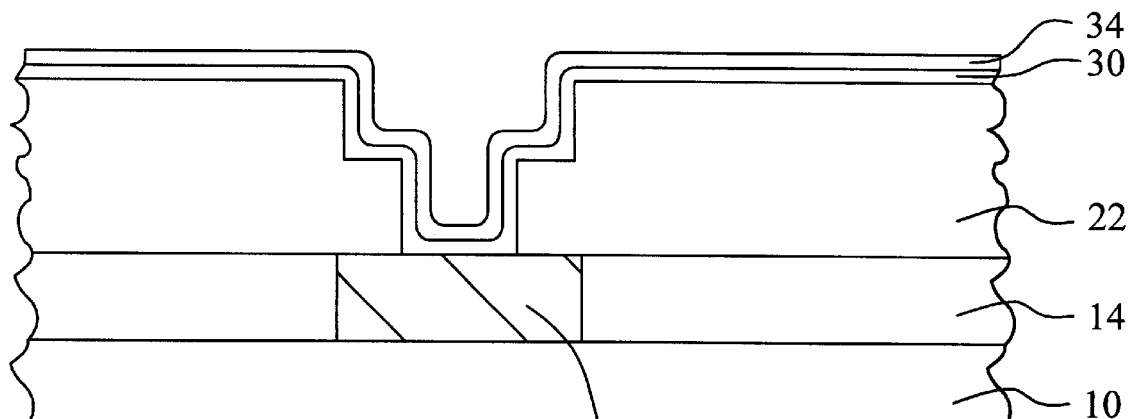
FIGS. 1 through 3 schematically illustrate in cross-section partially completed prior art integrated circuits using copper interconnect structures.
Figure 2:
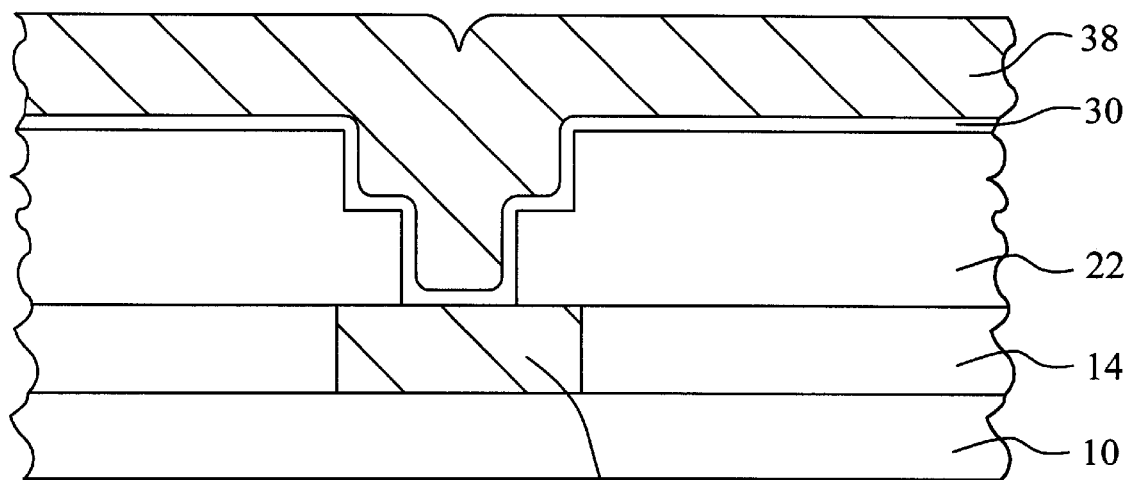
Figure 3:
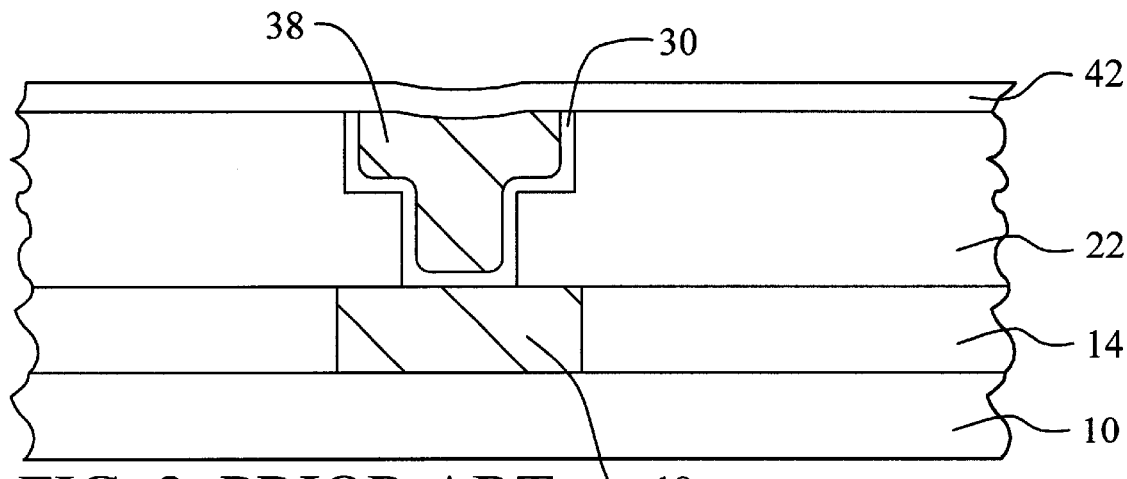
Figure 4:
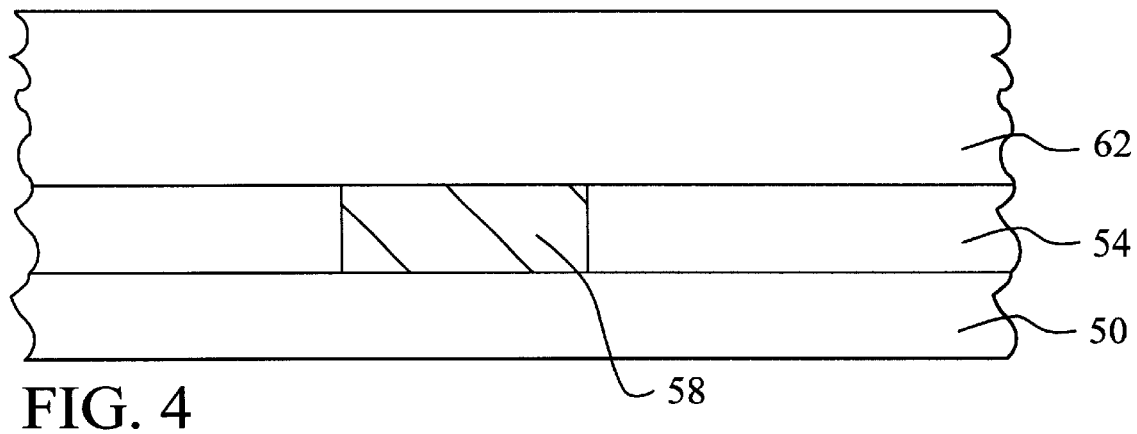
FIGS. 4 through 12 schematically illustrate in cross-sectional representation the present invention used to create copper interconnects.

Referring now more particularly to FIG. 4, there is illustrated a portion of a partially completed integrated circuit. In this preferred embodiment, the present invention will be used to create copper interconnects. It will be understood by those skilled in the art that the invention could be applied to the formation of other copper structures. Substrate 50 encompasses all underlying layers, devices, junctions, and other features that have been formed prior to the deposition of an isolation layer 54. Conductive traces 58 are provided in the isolation layer 54 as conventional in the art. An intermetal dielectric layer 62 is deposited overlying the conductive traces 58 and the isolating dielectric layer 54. The intermetal dielectric layer 62 is preferably composed of an oxide such as low k-value fluorinated silicate glass (FSG), which is planarized after deposition. Preferably, the intermetal dielectric layer 62 is deposited to a thickness of between about 4,000 Angstroms and 18,000 Angstroms.

Figure 5:
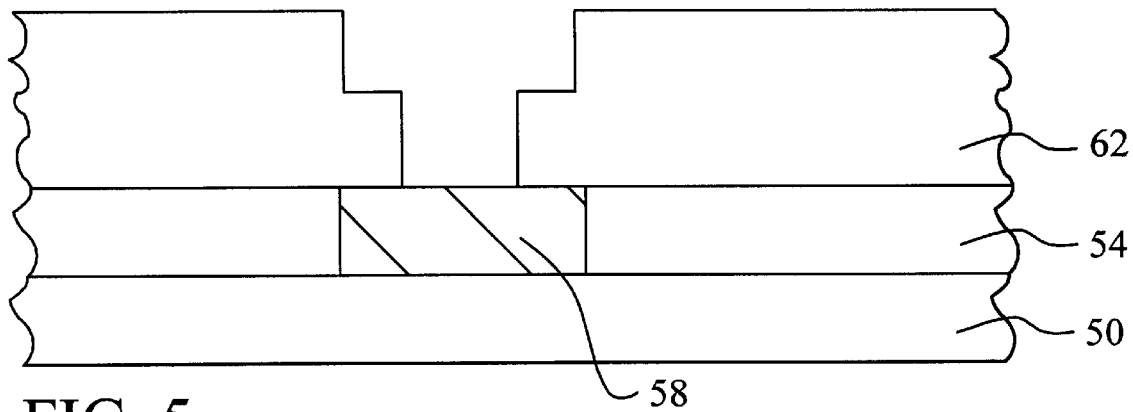

Referring now to FIG. 5, the intermetal dielectric layer 62 is patterned to form trenches to the underlying conductive traces 58. Many conventional techniques are available for forming the trenches. One such technique is to first etch through the intermetal dielectric layer 62, where not protected by a photoresist mask, to form the narrower, via trenches to the top surfaces of the conductive traces 58. Next, the intermetal dielectric layer 62 is etched down partially, where not protected by a photoresist mask, to form the wider, interconnect trenches. For purposes of the preferred embodiments, the combined via trench and interconnect trench will simply be referred to as the trench.

Figure 6:
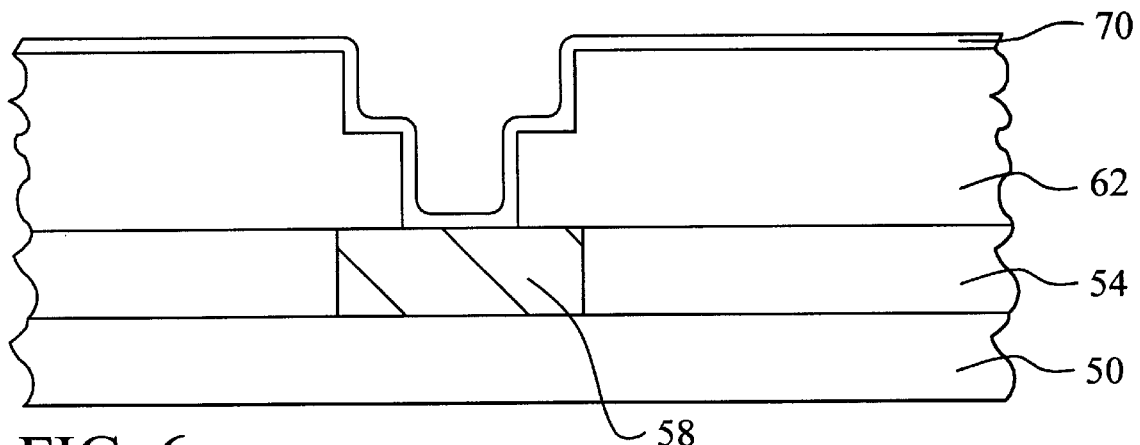

Referring now to FIG. 6, a barrier layer 70 is deposited overlying the intermetal dielectric layer 62, the exposed surface of the conductive traces 58, and within the the trenches. The purpose of the barrier layer 70 is to prevent oxidation and diffusion of the subsequently deposited copper metal layer while still providing a low resistance contact path between the conductive traces 58 and the subsequently formed copper interconnects. The barrier layer 70 is composed of a laminate of tantalum (Ta) and tantalum nitride (TaN). The first laminate, tantalum nitride is for improved adhesion to the intermetal dielectric layer. The second laminate, tantalum, is a low resistivity barrier. The barrier layer 70 is formed by depositing a layer of tantalum and tantalum nitride (TaN) to a thickness of between about 50 Angstroms and 800 Angstroms.

Figure 7:
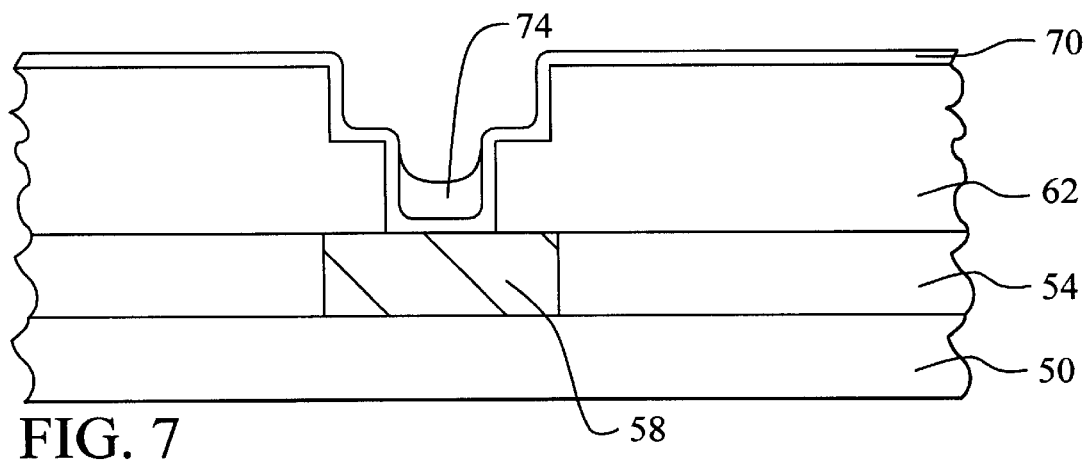

Referring now to FIG. 7, an important feature of the present invention is described. For electroless plating of copper to work, a seed layer must exist on the deposition surface prior to plating. The seed layer acts as a catalyst in the plating reaction and is either absorbed into the plating solution or else forms an alloy with the plated layer. Such seed layers are typically composed of either the compound to be plated, in this case copper, or another atomic species that can effectively catalyze the plating reaction. In the present invention, the seed layer is composed of platinum.

The platinum seed layer is formed in a simple and novel way. First, a platinum ionic seed solution 74 is coated overlying the barrier layer 70. This platinum ionic seed solution 74 is preferably applied using a spin-on procedure to form a thin layer across the wafer. As shown in FIG. 7, a significant amount of the solution collects in the trenches. The platinum ionic seed solution 74 of the present invention is composed of PtCl4 or Na2PtCl6 dissolved in isopropanol.

Figure 8:
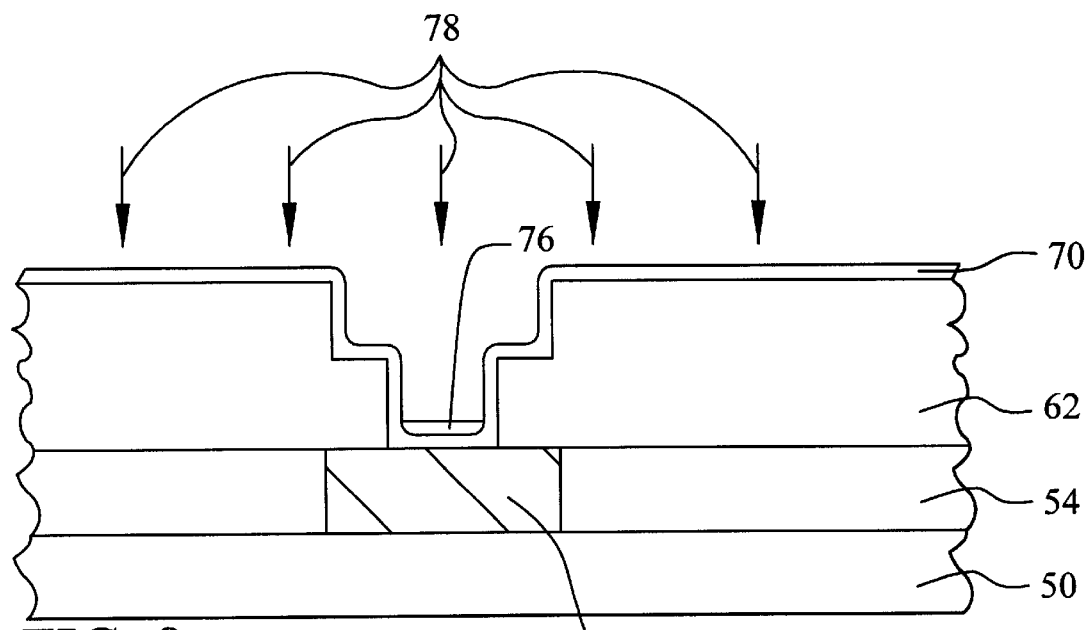

Referring now to FIG. 8, following the spin coating of the platinum ionic seed solution 74, the wafer is exposed to visible or ultraviolet light 78. The light source 78 is composed of spectral wavelengths shorter than 488 nanometers. Exposing the platinum ionic seed solution 74 to the light source 78 causes photo reduction of the platinum cations in solution to neutral platinum. The platinum deposits to form the platinum seed layer 76. If for example, the ionic seed solution 74 is composed of $Na_2PtCl_6$ and isopropanol, the ionic species in solution is $PtCl_6^{2-}$. The following exemplary reaction occurs in the ion seed solution 74 when exposed to the light source 78 at spectral frequencies of less than 488 nanometers:

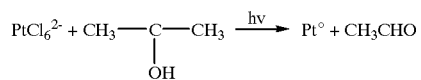

A platinum seed layer 76 is thus deposited overlying the barrier layer 70 in the trenches. This process for forming a platinum seed layer, for the subsequent deposition of copper by electroless plating, represents a significant simplification when compared to prior art approaches that use some form of physical vapor deposition (PVD) or chemical vapor deposition (CVD) to deposit the seed layer.

At this point, the barrier layer 70 may be polished away to the top surface of the intermetal dielectric layer 62. This step is optional to the process sequence and may be delayed until after deposition of the copper layer The disadvantage of this option is that the intermetal dielectric layer 62 will be exposed to the copper plating solution. Some copper can be absorbed into the dielectric in this way.

Figure 9:
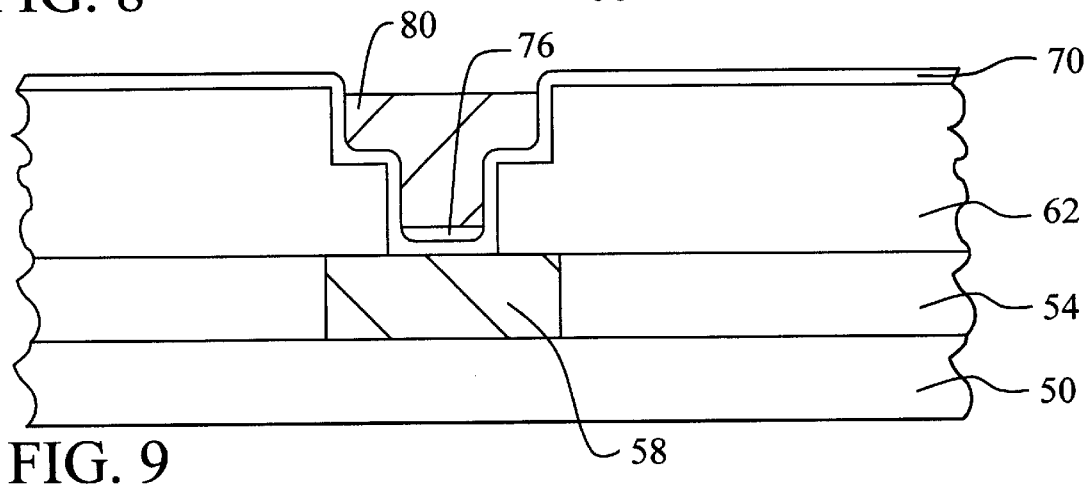

Referring to FIG. 9, another important feature of the present invention is presented. A copper layer 80 is deposited overlying the platinum seed layer 76 by electroless plating deposition. The copper layer fills the trench to form copper interconnects. The deposition process is timed to stop before the trenches are completely filled with the copper layer 80. Because the copper layer 80 only forms in the trenches, where the platinum seed layer 76 exists, and does not extend above the surface of the intermetal dielectric layer 62, it is not usually necessary to polish down excess copper material as in the prior art example. If a polish down of the copper layer 80 is required, the amount of polishing should be minimal. The copper layer 80 is deposited to a thickness of between about 3000 Angstroms and 17,500 Angstroms.

The copper layer 80 deposition is performed in a copper containing solution in an electroless deposition machine. Two different deposition solutions are disclosed here as typical for the preferred embodiment. A first copper containing solution is composed of: $CuSO_4.5H_2O$ at a concentration of about 3.1 grams/liter, disodium salt of EDTA at about 20.0 grams/liter, HCHO (formaldehyde) at about 20.0 grams/liter, $Na_2SO_4.10H_2O$ at about 40.0 grams/liter, and polyethyleneglycol at about 6.6 grams/liter. The pH of the solution is adjusted to about 7.0 using NaOH. The temperature is maintained between about 10 degrees C and about 90 degrees C.

A second copper containing solution is composed of $CuSO_4.5H_2O$ at about 8.5 grams/liter, HCHO (formaldehyde) at about 37% solution, 2 milliliters/liter, and disodium salt of EDTA at about 57.3 grams/liter. The pH of this solution is adjusted to about 11.2. The temperature is maintained at about 65 degrees C.

Figure 10:
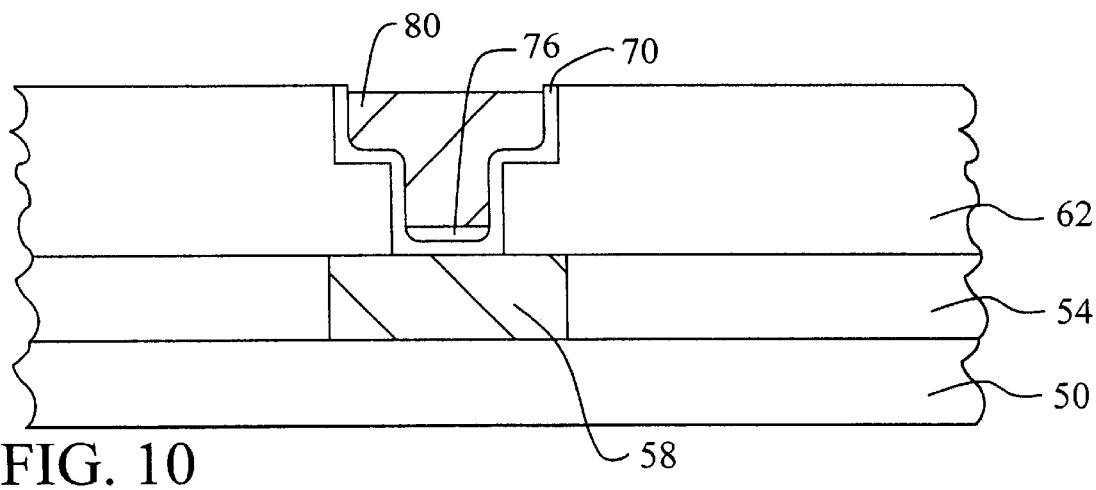

Referring now to FIG. 10, the barrier layer 70 is polished down to the top surface of the intermetal dielectric layer 62. If the barrier layer 70 was polished down prior to the deposition of the copper layer 80, then this step may be omitted. The polish step is performed using a conventional chemical mechanical polish (CMP).

Figure 11:
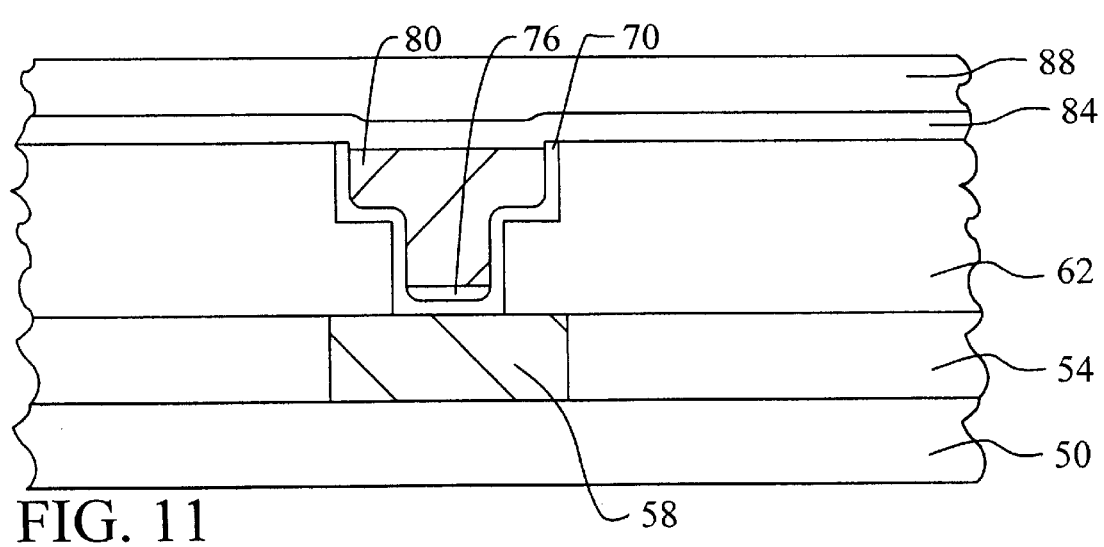

Referring now to FIG. 11, an encapsulation layer 84 is deposited overlying the copper interconnects 80 and the intermetal dielectric layer 62. The encapsulation layer 84 provides electrical isolation for the top surface of the copper layer 80. The encapsulation layer 84 is preferably composed of silicon nitride conventionally deposited to a thickness of between about 200 Angstroms and 1000 Angstroms. A passivation layer 88, preferably composed of plasma nitride, is formed overlying the encapsulation layer 84 to complete the fabrication of the integrated circuit device.

Referring now to FIG. 12, a completed single damascene interconnect formed by the present invention is illustrated. Conductive traces 108 are provided in a first isolation layer 104 overlying the semiconductor substrate 100. A conductive via plug 116, of tungsten or copper, is formed in a second isolation layer 112. The principle features of the present invention are then exemplified. An intermetal dielectric layer 120 is deposited overlying the conductive via plug 116 and the second isolation layer 112. The intermetal dielectric layer 120 is patterned to form trenches to the underlying conductive via plugs 116. A barrier layer 124, such as tantalum and tantalum nitride, is deposited overlying the intermetal dielectric layer 120, the exposed conductive via plugs 116, and within the trenches. The platinum seed layer 128 is deposited overlying the barrier layer 124 as described earlier in the embodiments. A copper layer 132 is deposited by electroless plating to fill the trenches and to thereby form copper interconnects. The exposed barrier layer 124 is polished down to the top surface of the intermetal dielectric layer 120. An encapsulation layer 136, such as silicon nitride, is deposited overlying the copper interconnects and the intermetal dielectric layer. Finally, a passivation layer 140 is deposited overlying the encapsulation layer to complete the fabrication of the integrated circuit device.

The process of the present invention provides a very manufacturable method to selectively plate copper for copper interconnects by forming a platinum seed layer in the fabrication of an integrated circuit device. Both dual damascene and single damascene copper interconnects have been fabricated using this novel approach.

While the invention has been particularly shown and described with reference to the preferred embodiments thereof, it will be understood by those skilled in the art that various changes in form and details may be made without departing from the spirit and scope of the invention.

What is claimed is:

1. A method to form copper interconnects in the fabrication of an integrated circuit device comprising:

providing a semiconductor substrate;

depositing a dielectric layer overlying said semiconductor substrate;

patterning said dielectric layer to form trenches;

depositing a barrier layer overlying said dielectric layer and within said trenches;

spin-coating a platinum ionic seed solution overlying said barrier layer;

depositing a platinum seed layer from said platinum ionic seed solution by exposing said platinum ionic seed solution to light;

removing said platinum seed layer except within said trenches;

depositing a copper layer overlying said platinum seed layer by electroless plating to thereby form copper interconnects, wherein said copper layer only deposits in said trenches, and wherein said deposition stops before said copper layer fills said trenches;

polishing away said barrier layer to the top surface of said dielectric layer so that said barrier layer remains only in said trenches;

depositing an encapsulation layer overlying said copper interconnects and said dielectric layer; and completing the fabrication of the integrated circuit device.

2. The method according to claim 1 wherein said barrier layer comprises tantalum and tantalum nitride deposited to a thickness of between about 50 Angstroms and 800 Angstroms.

3. The method according to claim 1 wherein said ionic seed solution comprises isopropanol and one of the group of: $PtCl_4$ and $Na_2PtCl_6$.

4. The method according to claim 1 wherein said step of depositing said seed layer from said ionic seed solution is by exposing said ionic seed solution to visible or ultraviolet light composed of spectral wavelengths shorter than 488 nanometers.

5. The method according to claim 1 wherein said step of depositing a copper layer by electroless plating is performed in a solution consisting of: $CuSO_4.5H_2O$, disodium salt of EDTA, HCHO (formaldehyde), and $Na_2SO_4.10H_2O$.

6. The method according to claim 1 wherein said step of depositing a copper layer by electroless plating is performed in a solution consisting of: $CuSO_4.5H_2O$, HCHO (formaldehyde), and disodium salt of EDTA.

7. The method according to claim 1 wherein said encapsulation layer is composed of silicon nitride deposited to a thickness of between about 200 Angstroms and 1,000 Angstroms.

8. The method according to claim 1 wherein said step of polishing away said barrier layer is performed before said step of depositing said copper layer.

9. A method to form copper interconnects in the fabrication of an integrated circuit device comprising:
provide a semiconductor substrate;
depositing a dielectric layer overlying said semiconductor substrate;
patterning said dielectric layer to form trenches;
depositing a barrier layer overlying said dielectric layer and within said trenches;
coating a platinum ionic seed solution overlying said barrier layer;
depositing a platinum seed layer from said platinum ionic seed solution by exposing said platinum ionic seed solution to light;
depositing a copper layer overlying said platinum seed layer by electroless plating to thereby form copper interconnects, wherein said copper layer only deposits in said trenches, and wherein said deposition stops before said copper layer fills said trenches;
polishing away said barrier layer to the top surface of said dielectric layer so that said barrier layer remains only in said trenches;
depositing an encapsulation layer overlying said copper interconnects and said dielectric layer; and
completing the fabrication of the integrated circuit device.

10. The method according to claim 9 wherein said barrier layer comprises tantalum and tantalum nitride deposited to a thickness of between about 50 Angstroms and 800 Angstroms.

11. The method according to claim 9 wherein said platinum ionic seed solution comprises isopropanol and one of the group of: $PtCl_4$ and $Na_2PtCl_6$.

12. The method according to claim 9 wherein said step of depositing a copper layer by electroless plating is performed in a solution consisting of: $CuSO_4.5H_2O$, disodium salt of EDTA, HCHO (formaldehyde), and $Na_2SO_4.10H_2O$.

13. The method according to claim 9 wherein said step of depositing a copper layer b electroless plating is performed in a solution consisting of: $CuSO_4.5H_2O$, HCHO (formaldehyde), and disodium salt of EDTA.

14. The method according to claim 9 wherein said step of depositing said platinum seed layer from said platinum ionic seed solution is by exposing said platinum ionic seed solution to visible or ultraviolet light composed of spectral wavelengths shorter than 488 nanometers.

15. The method according to claim 9 wherein said step of polishing away said barrier layer is performed before said step of depositing said copper layer.

16. A method to form copper interconnects in the fabrication of an integrated circuit device comprising:
providing a semiconductor substrate;
depositing a dielectric layer overlying said semiconductor substrate;
patterning said dielectric layer to form trenches;
depositing a barrier layer overlying said dielectric layer and within said trenches wherein said barrier layer comprises tantalum and tantalum nitride;
coating a platinum ionic seed solution overlying said barrier layer wherein said platinum ionic seed solution comprises isopropanol and one of the group of: $PtCl_4$ and $Na_2PtCl_6$;
depositing a platinum seed layer from said platinum ionic seed solution by exposing said platinum ionic seed solution to light at less than 488 nanometers;
depositing a copper layer overlying said platinum seed layer by electroless plating to thereby form copper interconnects, wherein said electroless plating is performed in a solution selected from the group containing: ($CuSO4.5H_2O$, disodium salt of EDTA, HCHO (formaldehyde) and $Na_2SO_4.10H_2O$ ) and ($CuSO_4.5H_2O$, HCHO (formaldehyde), and disodium salt of EDTA) and wherein said copper layer only deposits in said trenches, an d wherein said deposition stops before said copper layer fills said trenches;
polishing away said barrier layer to the top surface of said dielectric layer so that said barrier layer remains only in said trenches;
depositing an encapsulation layer overlying said copper interconnects and said dielectric layer; and
completing the fabrication of the integrated circuit device.

17. The method according to claim 16 wherein said step of depositing a copper layer by electroless plating is performed in a solution consisting of: $CuSO_4.5H_2O$ at a concentration of about 3.1 grams/liter, disodium salt of EDTA at about 20.0 grams/liter, HCHO (formaldehyde) at about 20.0 grams/liter, $Na_2SO_4.10H_2O$ at about 40.0 grams/liter, and polyethyleneglycol at about 6.6 grams/liter wherein the pH of said solution is adjusted to about 7.0 using NaOH and wherein the temperature of said solution is maintained between about 10 degrees and 90° C.

18. The method according to claim 16 wherein said step of depositing a copper layer by electroless plating is performed in a solution consisting of: $CuSO_4.5H_2O$ at about 8.5 grams/liter, HCHO (formaldehyde) at about 37% solution, 2 milliliters/liter, and disodium salt of EDTA at about 57.3 grams/liter wherein the pH of said solution is adjusted to about 11.2 and wherein the temperature of said solution is maintained at about 65° C.

19. The method according to claim 16 wherein said step of polishing away said barrier layer is performed before said step of depositing said copper layer.

* * * * *